US012418009B2

(12) United States Patent
Verma et al.

(10) Patent No.: US 12,418,009 B2
(45) Date of Patent: Sep. 16, 2025

(54) BONDED SEMICONDUCTOR STRUCTURE AND METHOD FOR FORMING THE SAME

(71) Applicant: UNITED MICROELECTRONICS CORP., Hsin-Chu (TW)

(72) Inventors: Purakh Raj Verma, Singapore (SG); Su Xing, Singapore (SG); Shyam Parthasarathy, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 438 days.

(21) Appl. No.: 17/204,966

(22) Filed: Mar. 18, 2021

(65) Prior Publication Data

US 2022/0270973 A1 Aug. 25, 2022

(30) Foreign Application Priority Data

Feb. 22, 2021 (CN) .......................... 202110198259.1

(51) Int. Cl.
  *H01L 25/065* (2023.01)
  *H01L 23/48* (2006.01)
  (Continued)

(52) U.S. Cl.
  CPC ............ *H01L 25/50* (2013.01); *H01L 23/481* (2013.01); *H01L 23/552* (2013.01);
  (Continued)

(58) Field of Classification Search
  CPC . H01L 23/552; H01L 23/481; H01L 23/5225; H01L 25/0657; H01L 2225/06537; H01L 2225/06541; H01L 2224/08145–08148; H01L 2224/80894–80896; H01L 2224/80357; H01L 2224/81894–84896; H01L 2224/82895–82897; H01L 2224/83894–83896
  See application file for complete search history.

(56) References Cited

U.S. PATENT DOCUMENTS

| 6,100,199 A | 8/2000 | Joshi |
| 6,597,053 B1 | 7/2003 | Anthofer |

(Continued)

FOREIGN PATENT DOCUMENTS

| CN | 107195615 A | 9/2017 |
| CN | 112236859 A | 1/2021 |
| DE | 197 16 102 A1 | 10/1998 |

*Primary Examiner* — Yu Chen
(74) *Attorney, Agent, or Firm* — Winston Hsu

(57) ABSTRACT

A bonded semiconductor structure includes a first device wafer and a second device wafer. The first device wafer includes a first insulating layer, a first device layer on the first insulating layer, and a first bonding layer on the first device layer. The second device wafer includes a second insulating layer, a second device layer on a first side of the second insulating layer, and a second bonding layer on the second device layer. The second device layer includes a second device region and a second transistor in the second device region. The second device wafer is bonded to the first device wafer by bonding the second bonding layer with the first bonding layer. A shielding structure is on a second side of the second insulating layer opposite to the first side and vertically overlapped with the second device region.

7 Claims, 8 Drawing Sheets

(51) Int. Cl.
*H01L 23/552* (2006.01)
*H01L 25/00* (2006.01)

(52) U.S. Cl.
CPC .................... *H01L 25/0657* (2013.01); *H01L 2224/08145* (2013.01); *H01L 2224/80895* (2013.01); *H01L 2224/80896* (2013.01); *H01L 2225/06537* (2013.01); *H01L 2225/06541* (2013.01)

(56) References Cited

U.S. PATENT DOCUMENTS

| | | |
|---|---|---|
| 8,174,108 B2 | 5/2012 | O'Neill |
| 9,653,410 B1 | 5/2017 | Holmes |
| 10,453,888 B2 * | 10/2019 | Kobayashi ........ H01L 27/14603 |
| 11,688,695 B2 | 6/2023 | Liu |
| 2011/0157445 A1 * | 6/2011 | Itonaga ............. H01L 27/14603 |
| | | 257/E21.705 |
| 2011/0266683 A1 * | 11/2011 | Feng .................... H01L 25/074 |
| | | 257/773 |
| 2012/0313227 A1 | 12/2012 | Or-Bach |
| 2016/0141249 A1 | 5/2016 | Kang |
| 2018/0240797 A1 * | 8/2018 | Yokoyama ............ H01L 25/065 |
| 2018/0286910 A1 * | 10/2018 | Kobayashi ........ H01L 27/14636 |
| 2020/0006371 A1 | 1/2020 | Huo |
| 2020/0402951 A1 | 12/2020 | Chen |
| 2021/0159212 A1 * | 5/2021 | Jing ................... H01L 25/0652 |

\* cited by examiner

BONDED SEMICONDUCTOR STRUCTURE AND METHOD FOR FORMING THE SAME

BACKGROUND OF THE INVENTION

1. Field of the Invention

The invention relates to a bonded semiconductor structure and a method for forming the same. More particularly, the invention relates to a bonded semiconductor structure having a shielding structure and a method for forming the same.

2. Description of the Prior Art

A 3D IC refers to a three-dimensional stack of chips formed by using wafer-level bonding and through silicon via (TSV) technologies. In comparison with conventional two-dimensional chips, a 3D IC may have the advantages of using the space more effectively, shorter signal transmission distances between chips, and lower interconnection resistances, and has gradually become the mainstream technology of power converters, low noise amplifiers, radio frequency (RF) or millimeter wave (MMW) components.

However, current 3D ICs still have problems to be improved, such as heat dissipation, electromagnetic shielding of stacked chips, and harmonic distortions and cross-talk during operation. Furthermore, how to further reduce the size of a 3D IC is also an important subject in the field.

SUMMARY OF THE INVENTION

In light of the above, the present invention is directed to provide a bonded semiconductor structure and method for forming the same, which has a shielding structure formed on a side of the insulating layer opposite to the semiconductor layer and vertically overlapped with the device region of the semiconductor layer. The shielding structure may help to dissipate heat from the device region as well as provide electromagnetic shielding to the device region. Furthermore, the present invention also provides a bonded semiconductor structure having mirror transistors, which is able to provide the required amount of current with a better current matching between the transistors while the areas of the respective transistors may be reduced to half, so that a smaller form factor of the chip and reduced harmonic distortions and signal cross-talk may be achieved.

According to an embodiment of the present invention, a bonded semiconductor structure is provided. The bonded semiconductor structure includes a first device wafer and a second device wafer. The first device wafer includes a first insulating layer, a first device layer on the first insulating layer and comprising a first device region and a first transistor disposed in the first device region, and a first bonding layer on the first device layer. The second device wafer includes a second insulating layer, a second device layer on a first side of the second insulating layer and comprising a second device region and a second transistor disposed in the second device region, and a second bonding layer disposed on the second device layer, wherein the second device wafer is bonded to the first device wafer by bonding the second bonding layer with the first bonding layer. A first shielding structure is disposed on a second side of the second insulating layer and vertically overlapped with the second device region. The second side is opposite to the first side.

According to an embodiment of the present invention, a bonded semiconductor structure is provided. The bonded semiconductor structure includes a first device wafer, a second device wafer, and a third device wafer. The first device wafer includes a first insulating layer, a first device layer on the first insulating layer and comprising a first device region and a first transistor disposed in the first device region, and a first bonding layer on the first device layer. The second device wafer includes a second insulating layer, a second device layer on a first side of the second insulating layer and comprising a second device region and a second transistor disposed in the second device region, and a second bonding layer on the second device layer, wherein the second device wafer is bonded to the first device wafer by bonding the second bonding layer and the first bonding layer. The bonded semiconductor structure further includes a first shielding structure disposed on a second side of the second insulating layer opposite to the first side of the insulating layer and vertically overlapped with the second device region, a fourth insulating layer on the second side of the second insulating layer and covering the shielding structure, and a fourth bonding layer on the fourth insulating layer. The third device wafer includes a third insulating layer, a third device layer on a first side of the third insulating layer and comprising a third device region and a third transistor disposed in the third device region, and a third bonding layer on the third device layer, wherein the third device wafer is bonded to the second device wafer by bonding the third bonding layer and the fourth bonding layer. A second shielding structure is disposed on a second side of the third insulating layer opposite to the first side of the third insulating layer and vertically overlapped with the third device region.

According to an embodiment of the present invention, a method for forming a bonded semiconductor structure is provided and includes the following steps. First, a first device wafer and a second device wafer are provided. The first device wafer includes a first insulating layer, a first device layer on the first insulating layer and comprising a first device region and a first transistor disposed in the first device region, and a first bonding layer on the first device layer. The second device wafer includes a second insulating layer, a second device layer on a first side of the second insulating layer and comprising a second device region and a second transistor disposed in the second device region, and a second bonding layer on the second device layer. Subsequently, first bonding layer and the second bonding layer are bonded by bonding the first bonding layer and the second bonding layer. After that, a first through substrate via (TSV) is formed and extends from a second side of the second insulating layer opposite to the first side of the second insulating layer through the second insulating layer and a portion of the second device layer to electrically connect to the second transistor. Thereafter, a first shielding structure and a first conductive structure are formed on the second side of the second insulating layer, wherein the first shielding structure is vertically overlapped with the second device region, and the first conductive structure directly contacts the first TSV.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
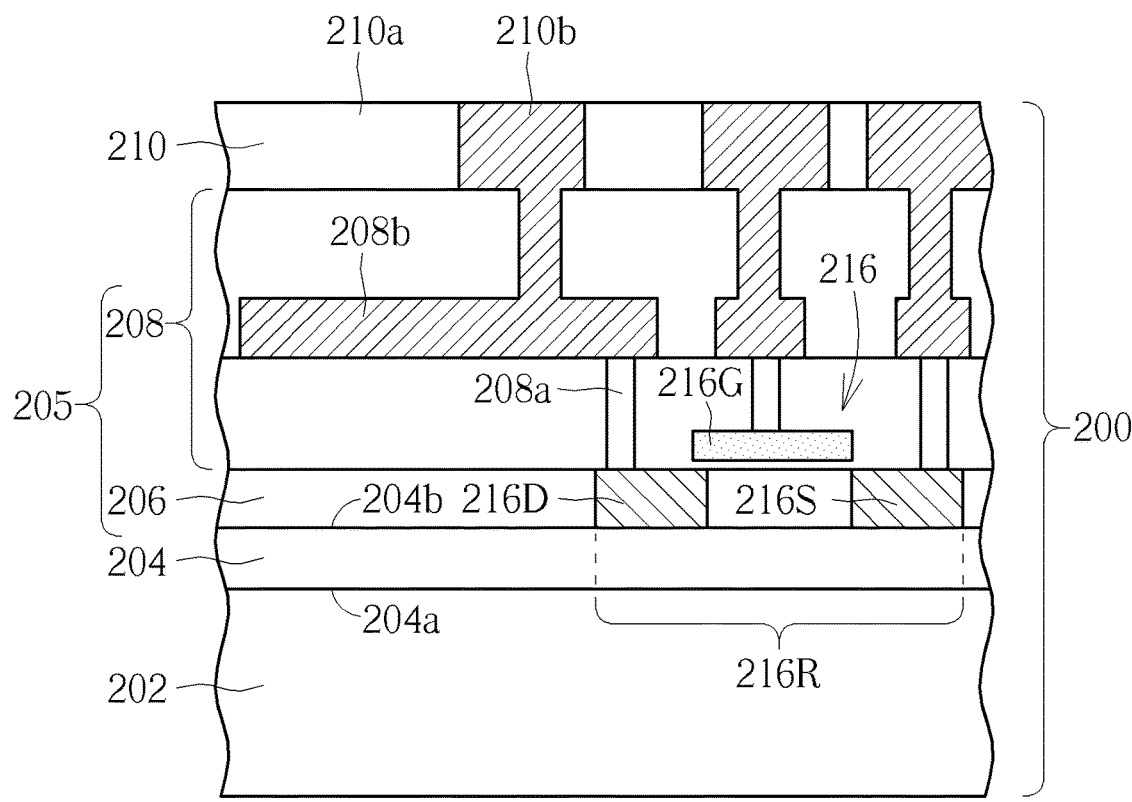
FIG. 1 to FIG. 4 are schematic cross-sectional diagrams illustrating the steps of forming a bonded semiconductor structure according to a first embodiment of the present invention.
Figure 1:
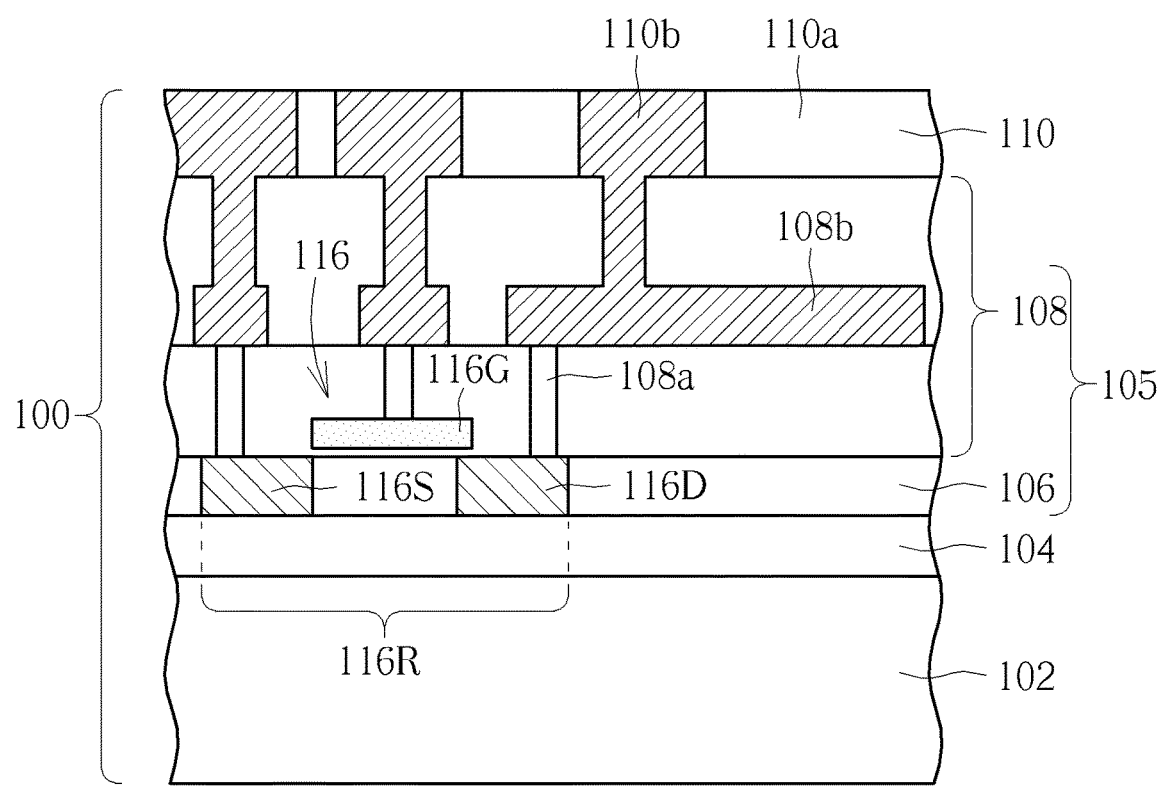

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

It should be readily understood that the meaning of "on", "above", "over" and the like in the present disclosure should be interpreted in the broadest manner such that these terms not only means "directly on something" but also includes the meaning of "on something with an intermediate feature or a layer therebetween".

Furthermore, spatially relative terms, such as "beneath", "below", "under', "lower", "above", "upper", "on", "over" and the like may be used herein to describe one element or feature's spatial relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate" used herein include any structure having an exposed surface onto which a layer is deposited according to the present invention, for example, to form the circuit structure. The term substrate is understood to include semiconductor wafers, but not limited thereto. The term substrate is also used to refer to semiconductor structures during processing, and may include other layers that have been fabricated thereupon.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

Please refer to FIG. 1 to FIG. 4, which are schematic cross-sectional diagrams illustrating the steps of forming a bonded semiconductor structure according to a first embodiment of the present invention. First, as shown in FIG. 1, a first device wafer 100 and a second device wafer 200 are provided.

According to an embodiment of the present invention, the first device wafer 100 may be formed by using a SOI (silicon on insulator) substrate. As shown in FIG. 1, the first device wafer 100 may include a first substrate 102, a first insulating layer 104 on the first substrate 102, a first device layer 105 on the first insulating layer 104, and a first bonding layer 110 on the first insulating layer 104. The first substrate 102 may include a semiconductor material such as silicon. For example, the first substrate 102 may be a lightly-doped silicon substrate having high resistance. In some embodiments, a charge trap layer (not shown) may be provided on the first substrate 102 interfacing the first substrate 102 to reduce the harmonic distortions and signal cross-talk caused by induced charges in the first substrate 102 during device operation. The first insulating layer 104 is used to electrically isolate the first substrate 102 and the first device layer 105. The first insulating layer 104 may include a dielectric material, such as silicon oxide. The first device layer 105 may include a first semiconductor layer 106 and a first interconnecting layer 108 on the first semiconductor layer 106, wherein the first semiconductor layer 106 is separated from the first substrate 102 by the first insulating layer 104. The first semiconductor layer 106 may include a semiconductor material, such as silicon (Si), germanium (Ge), silicon-germanium (SiGe), carbon doped silicon germanium (SiGe:C), silicon carbide (SiC), or a combination thereof, but is not limited thereto. The first semiconductor layer 106 may include a first device region 116R in which a first transistor 116 is to be formed. According to an embodiment of the present invention, the first transistor 116 may be a field effect transistor (FET) having a first source region 116S and a first drain region 116D formed in the first semiconductor layer 106, and a first gate region 116G formed on the first semiconductor layer 106 between the first source region 116S and the first drain region 116D and being spaced apart from the first semiconductor layer 106 by a gate dielectric layer (not shown). The first gate region 116G controls turn-on and turn-off of a channel region between the first source region 116S and the first drain region 116D. The first interconnecting layer 108 may include multiple dielectric layers (not shown) made of dielectric materials such as silicon oxide, silicon nitride, or other suitable dielectric materials. The first interconnecting layer 108 also includes electrical interconnecting structures formed in the dielectric layers such as contacts 108a and interconnecting structures 108b. The contacts 108a and the interconnecting structures 108b may include metals such as copper (Cu), aluminum (Al), tungsten (W), titanium (Ti), titanium nitride (TiN), tantalum (Ta), tantalum nitride (TaN), or a combination thereof, but is not limited thereto. The first interconnecting layer 108 may further include circuit elements (not shown) such as capacitors, inductors, resistors, embedded memories, but are not limited thereto. The first source region 116S, the first drain region 116D, and the first gate region 116G may be electrically connected to the interconnecting structures 108b through the contacts 108a. The first bonding layer 110 may include a first bonding dielectric layer 110a and a plurality of first bonding pads 110b formed in the first bonding dielectric layer 110a. The first bonding dielectric layer 110a may include a dielectric material such as silicon oxide, silicon nitride, or other dielectric materials suitable for bonding with the second bonding dielectric layer 210a of the second device wafer 200. The first bonding pads 110b may include a conductive metal suitable for bonding with the second bonding pads 210b of the second device wafer 200, such as copper.

According to an embodiment of the present invention, the second device wafer 200 may be formed by using a SOI (silicon on insulator) substrate. As shown in FIG. 1, the second device wafer 200 may include a second substrate 202, a second insulating layer 204 on the second substrate 202, a second device layer 205 on the second insulating layer 204, and a second bonding layer 210 on the second insulating layer 204. In other words, the second device layer 205 and the second substrate 202 are respectively on a first side 204a and a second side 204b of the insulating layer 204 that are opposite to each other. The second substrate 202 may include a semiconductor material such as silicon, or other substrate materials suitable for supporting the second device wafer 200 during the semiconductor manufacturing process. The second insulating layer 204 is used to electrically isolate the second substrate 202 and the second device layer 205. The second insulating layer 204 may include a dielectric material, such as silicon oxide. The second device layer 205 may include a second semiconductor layer 206 and a second interconnecting layer 208 on the second semiconductor layer 206, wherein the second semiconductor layer 206 is separated from the second substrate 202 by the second insulating layer 204. The second semiconductor layer 206 may include a semiconductor material, such as silicon (Si), germanium (Ge), silicon-germanium (SiGe), carbon doped silicon germanium (SiGe:C), silicon carbide (SiC), or a combination thereof, but is not limited thereto. The second semiconductor layer 206 may include a second device region 216R in which a second transistor 216 is to be formed. According to an embodiment of the present invention, the second transistor 216 may be a field effect transistor (FET) having a second source region 216S and a second drain region 216D formed in the second semiconductor layer 206, and a second gate region 216G formed on the second semiconductor layer 206 between the second source region 216S and the second drain region 216D and being spaced apart from the second semiconductor layer 206 by a gate dielectric layer (not shown). The second gate region 216G controls turn-on and turn-off of a channel region between the second source region 216S and the second drain region 216D. The second interconnecting layer 208 may include multiple dielectric layers (not shown) made of dielectric materials such as silicon oxide, silicon nitride, or other suitable dielectric materials. The second interconnecting layer 208 also includes electrical interconnecting structures formed in the dielectric layers such as contacts 208a and interconnecting structures 208b. The contacts 208a and the interconnecting structures 208b may include metals such as copper (Cu), aluminum (Al), tungsten (W), titanium (Ti), titanium nitride (TiN), tantalum (Ta), tantalum nitride (TaN), or a combination thereof, but is not limited thereto. The second interconnecting layer 208 may further include circuit elements (not shown) such as capacitors, inductors, resistors, embedded memories, but are not limited thereto. The second source region 216S, the second drain region 216D, and the second gate region 216G may be electrically connected to the interconnecting structures 208b through the contacts 208a. The second bonding layer 210 may include a second bonding dielectric layer 210a and a plurality of second bonding pads 210b formed in the second bonding dielectric layer 210a. The second bonding dielectric layer 210a may include a dielectric material such as silicon oxide, silicon nitride, or other dielectric materials suitable for bonding with the first bonding dielectric layer 110a of the first device wafer 100. The second bonding pads 210b may include a conductive metal suitable for bonding with the first bonding pads 110b of the first device wafer 100, such as copper.

Figure 2:
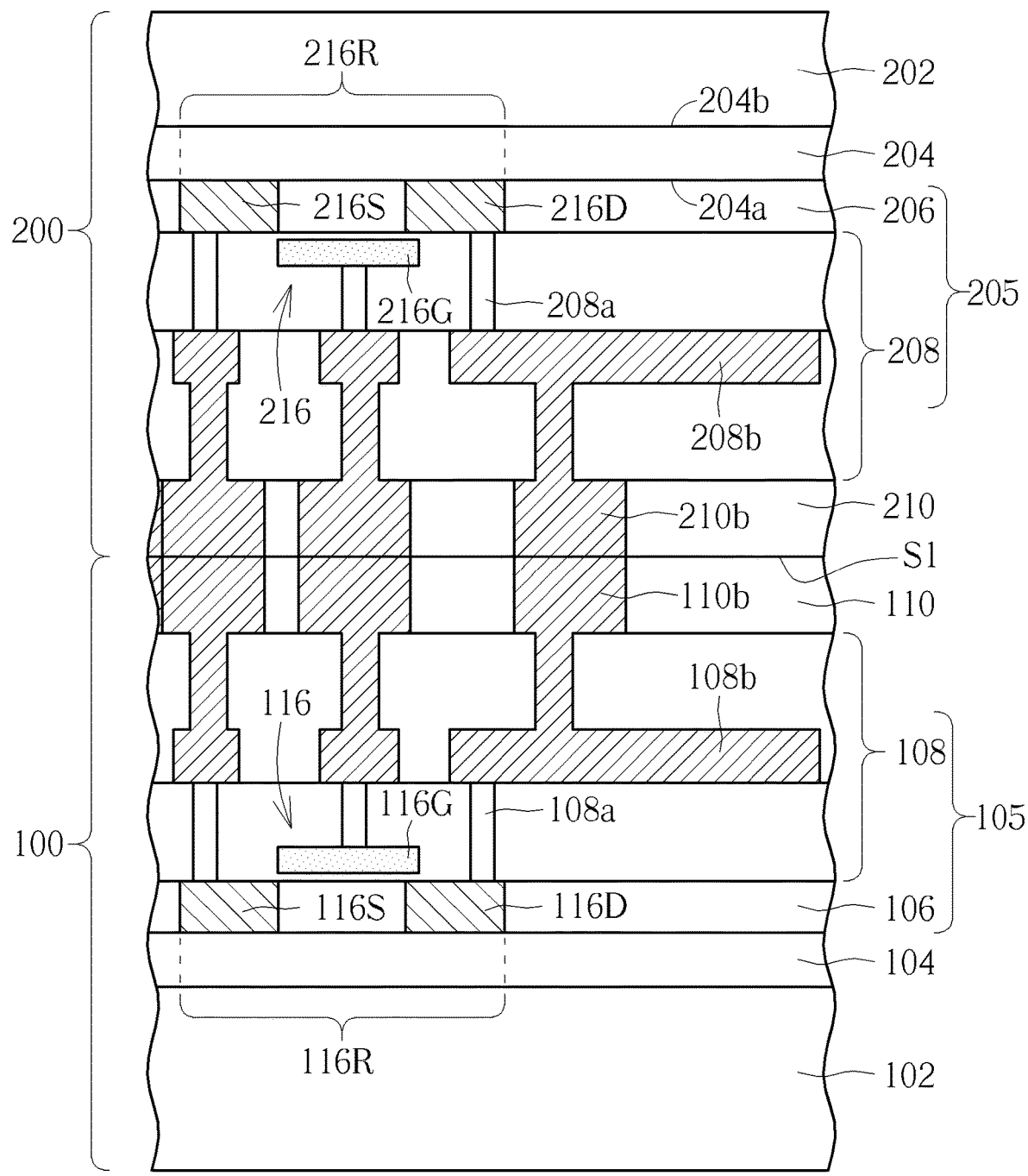

As shown in FIG. 2, subsequently, the second device wafer 200 is oriented to allow the second bonding layer 210 facing the first bonding layer 110 of the first device wafer 100. After that, the second device wafer 200 is stacked on and bonded to the first device wafer 100 by direct bonding the first bonding dielectric layer 110a and the second bonding dielectric layer 210a, and the corresponding first bonding pad 110b and the second bonding pad 210b. After the bonding process, the first bonding pads 110b and the second bonding pads 210b are electrically bonded, respectively, and a bonding interface S1 is formed between the first bonding layer 110 and the second bonding layer 210.

Figure 3:
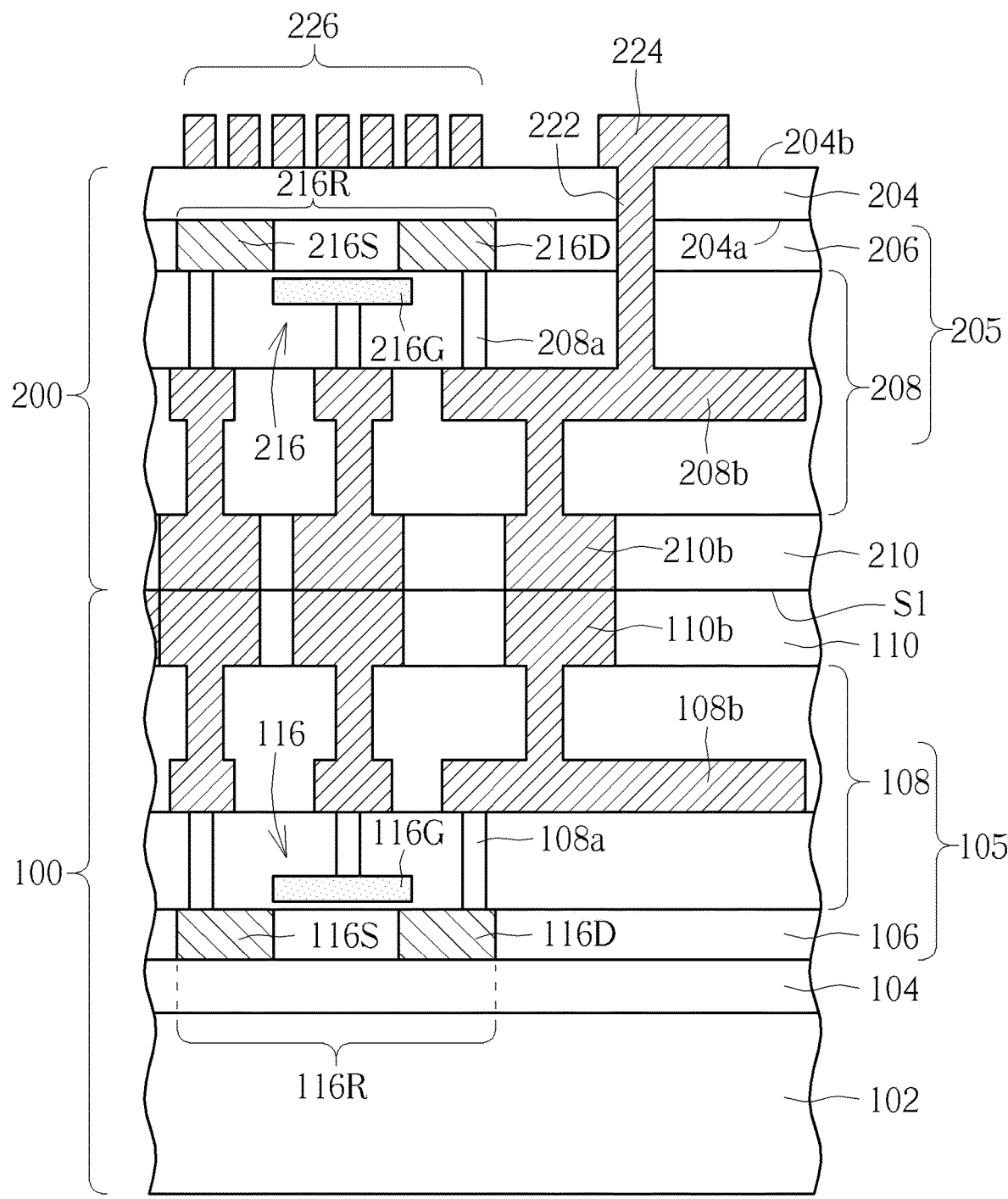

As shown in FIG. 3, subsequently, the second substrate 202 of the second device wafer 200 is removed by, for example, performing a polishing process or an etching process to expose the second side 204b of the second insulating layer 204. After that, a first through substrate via (TSV) 222 is formed and extends from the second side 204b of the second insulating layer 204 through the second insulating layer 204 and a portion of the second device layer 205 to electrically connect to the second transistor 216. A first shielding structure 226 and a first conductive structure 224 are then formed on the second side 204b of the second insulating layer 204, wherein the first conductive structure 224 directly contacts a terminal of the first TSV 222, and the first shielding structure 226 is vertically (the stacking direction) overlapped with the second device region 216R. In a preferred embodiment, the first shielding structure 226 may completely overlap the entire area of the second device region 216R to provide better heat dissipation efficiency and electromagnetic shielding to the second device region 216R. According to an embodiment of the present invention, the first shielding structure 226 and the first conductive structure 224 may be formed simultaneously through the same process, and may include a same metal material such as copper, aluminum, nickel, silver, tin, platinum, titanium, iron, or a combination thereof, but is not limited thereto. In other embodiments, the first shielding structure 226 and the first conductive structure 224 may be formed by different processes and may include different metal materials.

Figure 4:
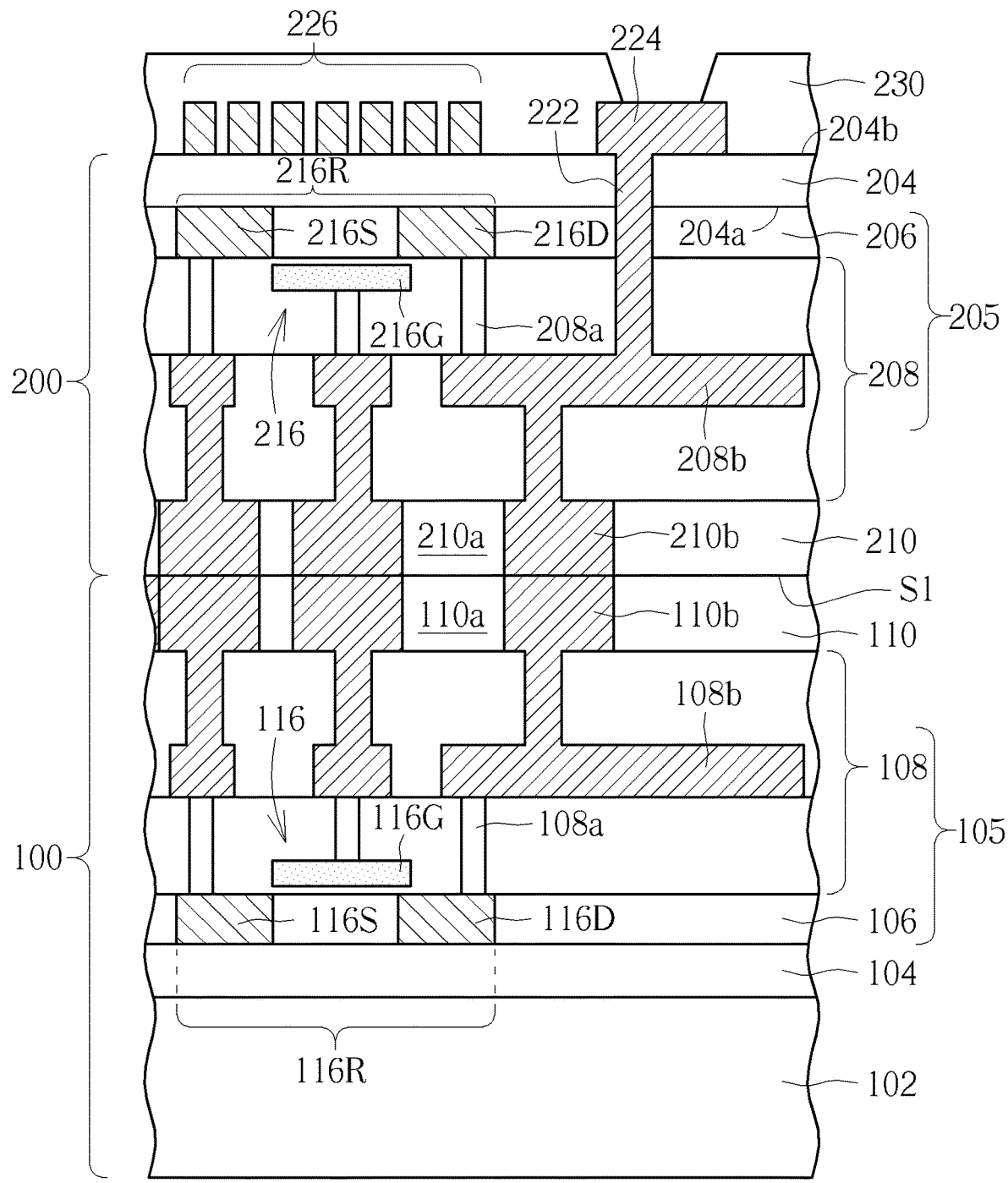

As shown in FIG. 4, subsequently, a passivation layer 230 is formed on the second side 204b of the second insulating layer 204 and covering the first shielding structure 226 and the first conductive structure 224. A patterning process such as a photolithography-etching process may be performed to form an opening in the passivation layer 230 to expose a portion of the first conductive structure 224, while the first shielding structure 226 is still completely covered by the passivation layer 230. The passivation layer 230 may include an organic dielectric material, such as polyimide (PI), but is not limited thereto. In the embodiment shown in FIG. 4, the first conductive structure 224 is used as a bonding pad for electrical connecting to the outside circuits.

The first shielding structure 226 is electrically isolated from other structures by being surrounded by the second insulating layer 204 and the passivation layer 230.

Figure 5:
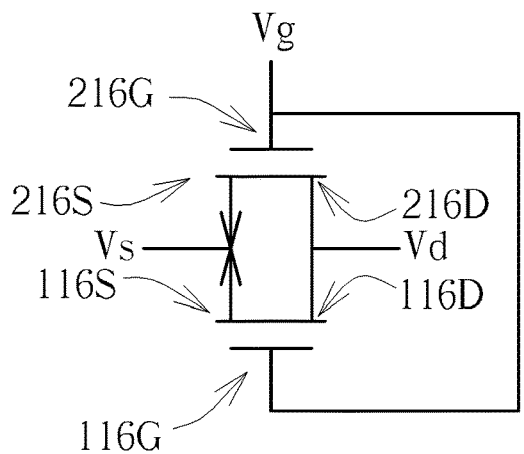
FIG. 5 is an exemplary circuit diagram illustrating the interconnections of the transistors of the bonded semiconductor structure according to an embodiment of the present invention.

Please refer to FIG. 4 and FIG. 5. FIG. 5 is an exemplary circuit diagram illustrating the interconnections of the transistors of the bonded semiconductor structure according to an embodiment of the present invention. The layout of the first transistor 116 and the second transistor 216 may be designed to allow the first source region 116S, the first drain region 116D, and the first gate region 116G of the first transistor 116 being vertically aligned and electrically connected to the second source region 216S, the second drain region 216D, and the second gate region 216G of the second transistor 216, respectively, through the contacts 108a, 208a and the interconnecting structures 108b, 208b after bonding the first device wafer 100 and the second device wafer 200, thereby realizing the circuit shown in FIG. 5. In a preferred embodiment, the designs of the first transistor 116 and the second transistor 216 are mirror to each other along the bonding interface S1 between the first bonding layer 110 and the second bonding layer 210 to achieve a better current matching.

As shown in FIG. 5, the first source region 116S and the second source region 216S are electrically connected to a same source voltage Vs, the first drain region 116D and the second drain region 216D are electrically connected to a same drain voltage Vd, and the first gate region 116G and the second gate region 216G are electrically connected to a same gate voltage Vg. In this way, the first transistor 116 and the second transistor 216 may be driven synchronously to provide an amount of current that is the sum of the both. In other words, in comparison with the conventional technology using a single transistor to provide the required amount of current, the present invention has at least the following advantages. First, the present invention may provide the required amount of current while the areas of the respective transistors may be reduced to half, so that a smaller chip size may be achieved. Second, as the areas of the transistors are reduced, the overlapping area of the transistors and the first substrate 102 may become smaller, which is beneficial for reducing harmonic distortions and signal crosstalk caused by the induced charges in the first substrate 102. Third, the first shielding structure 226 may vertically overlap the first device region 116R and the second device region 216R at the same time, so that first shielding structure 226 may provide electromagnetic shielding to both of the first transistor 116 and the second transistor 216.

Figure 6:
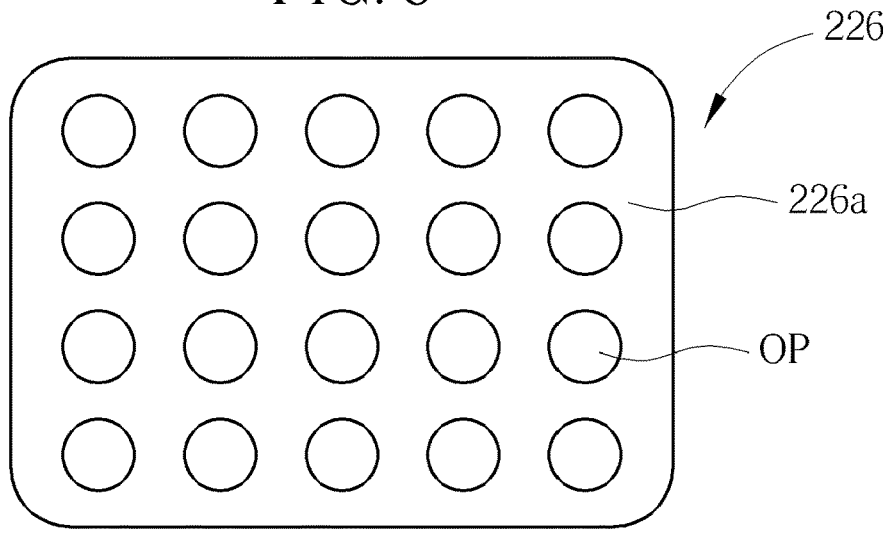
FIG. 6 and FIG. 7 are schematic plan views of the shielding structures according to some embodiments of the present invention.
Figure 7:
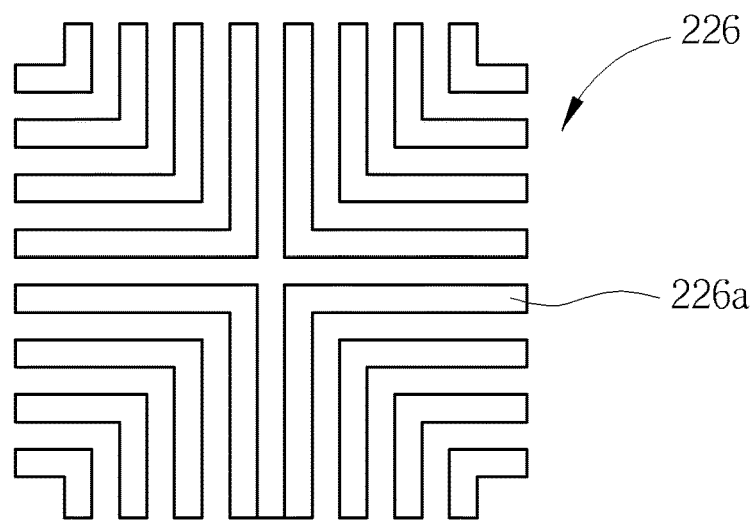

Please refer to FIG. 6 and FIG. 7, which are schematic plan views of the shielding structures (such as the first shielding structure 226) according to some embodiments of the present invention. As shown in FIG. 6, the first shielding structure 226 may include a metal layer 226a having a plurality of openings OP formed therein to form a mesh-like pattern. As shown in FIG. 7, the first shielding structure 226 may include a plurality of strip-shaped metal layer 226a to form an array of strip-shaped patterns. It should be understood that the layouts of the shielding structures illustrated above are only an examples, and may be adjusted according to application needs. Preferably, the layout of first shielding structure may vertically overlap the entire area of the device region to provide better heat dissipation efficiency and electromagnetic shielding to the device region.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
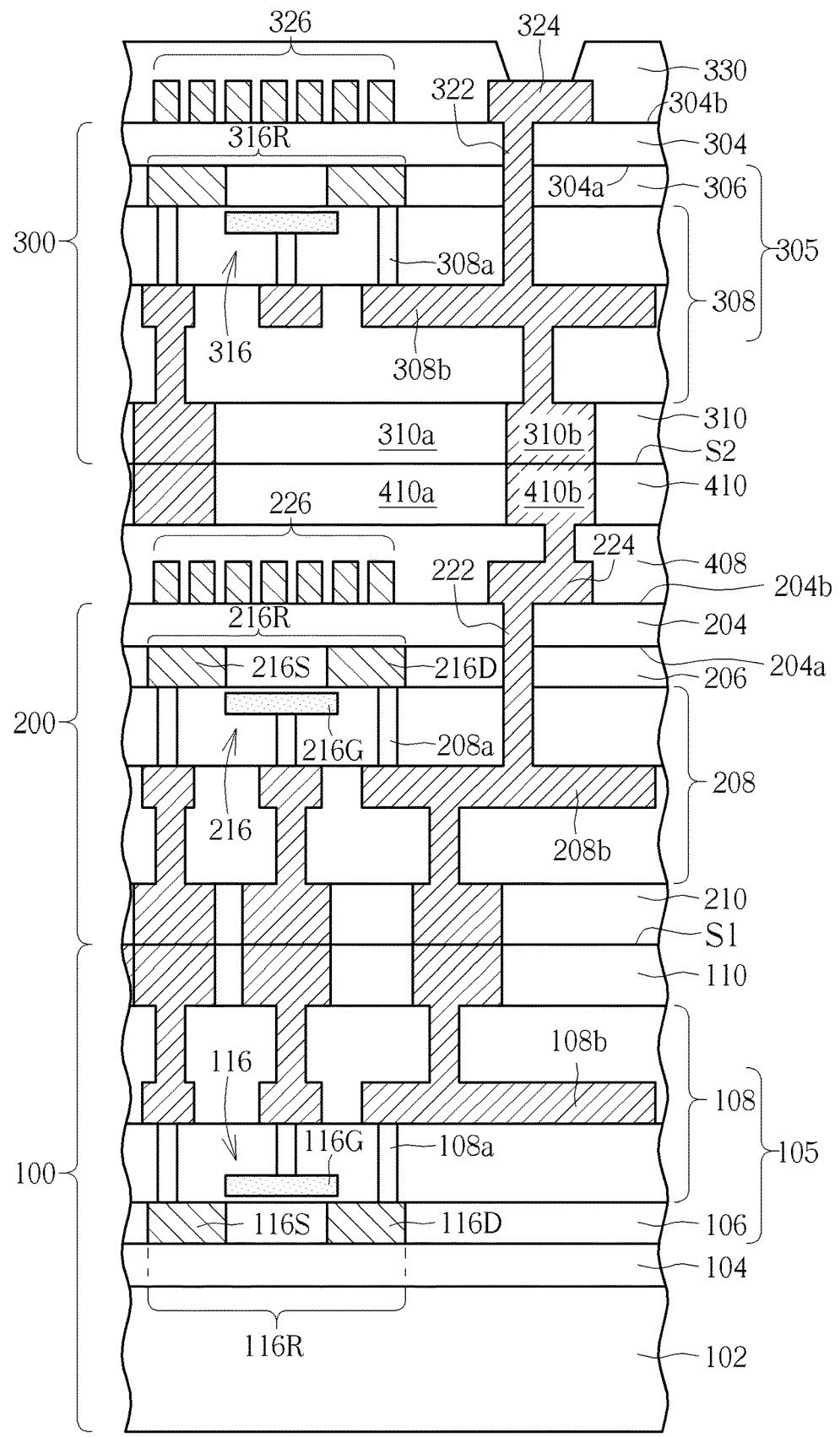
FIG. 8 is a schematic cross-sectional diagram illustrating a bonded semiconductor structure according to a second embodiment of the present invention.

Please refer to FIG. 8, which is a schematic cross-sectional diagram illustrating a bonded semiconductor structure according to a second embodiment of the present invention. The bonded semiconductor structure shown in FIG. 8 and the bonded semiconductor structure shown in FIG. 4 are different in that, the bonded semiconductor structure shown in FIG. 8 has a third device wafer 300 bonded on the second device wafer 200.

Specifically, as shown in FIG. 8, after bonding the first device wafer 100 and the second device wafer 200 and forming the first shielding structure 226 and the first conductive structure 224, a fourth insulating layer 408 is then formed on the second side 204b of the second insulating layer 204 and completely covering the first shielding structure 226 and the first conductive structure 224, and a fourth bonding layer 410 is formed on the fourth insulating layer 408. The fourth insulating layer 408 may include a single dielectric layer or multiple dielectric layers made of dielectric materials such as silicon oxide, silicon nitride, or other suitable dielectric materials. The fourth bonding layer 410 may include a fourth bonding dielectric layer 410a and a plurality of fourth bonding pads 410b formed in the fourth bonding dielectric layer 410a. The fourth bonding dielectric layer 410a may include a dielectric material such as silicon oxide, silicon nitride, or other dielectric materials suitable for bonding with the third bonding dielectric layer 310a of the third device wafer 300. The fourth bonding pads 410b may include a conductive metal suitable for bonding with the third bonding pads 310b of the third device wafer 300, such as copper.

As shown in FIG. 8, the third device wafer 300 may include a third insulating layer 304 having a first side 304a and a second side 304b opposite to the first side 304a, a third device layer 305 on the first side 304a of the third insulating layer 304, and a third bonding layer 310 on the third device layer 305. The third insulating layer 304 may include a dielectric material, such as silicon oxide. The third device layer 305 may include a third semiconductor layer 306 and a third interconnecting layer 308 on the third semiconductor layer 306. The third semiconductor layer 306 may include a semiconductor material, such as silicon (Si), germanium (Ge), silicon-germanium (SiGe), carbon doped silicon germanium (SiGe:C), silicon carbide (SiC), or a combination thereof, but is not limited thereto. The third semiconductor layer 306 may include a third device region 316R in which a third transistor 316 is to be formed. According to an embodiment of the present invention, the third transistor 316 may be a field effect transistor (FET) or other types of active devices or passive devices. The third interconnecting layer 308 may include multiple dielectric layers (not shown), and electrical interconnecting structures such as contacts 308a and interconnecting structures 308b may be formed in the dielectric layers of the third interconnecting layer 308. The third interconnecting layer 308 may further include circuit elements (not shown) such as capacitors, inductors, resistors, embedded memories, but are not limited thereto. The terminals of the third transistor 316 (such as the source terminal, the drain terminal, and the gate terminal) may be electrically connected to the interconnecting structures 308b through the contacts 308a. It should be noted that, the third device wafer 300 may be formed by using a SOI (silicon on insulator) substrate. That is, a third substrate (has been removed in the step shown in FIG. 8.) may be disposed on the second side 304b of the third insulating layer 304 for supporting the third device wafer 300 during the semiconductor manufacturing process.

The third bonding layer 310 may include a third bonding dielectric layer 310a and a plurality of third bonding pads 310b formed in the third bonding dielectric layer 310a. The third device wafer 300 is oriented to allow the third bonding layer 310 facing the fourth bonding layer 410, and is then stacked on and bonded to the second device wafer 200 by direct bonding the third bonding dielectric layer 310a and the fourth bonding dielectric layer 410a, and the corresponding third bonding pad 310b and the fourth bonding pad 410b. After the bonding process, the third bonding pads 310b and the fourth bonding pads 410b are electrically bonded, respectively, and a bonding interface S2 is formed between the third bonding layer 310 and the fourth bonding layer 410. In some embodiments, the third transistor 316 may be electrically connected to the devices in the second device wafer 200 and the first device wafer 100 through, for example the contacts 308a, the interconnecting structures 308b, the third bonding layer 310, the fourth bonding layer 410, the first conductive structure 224, and the first TSV 222.

After bonding the third bonding layer 310 onto the second device wafer 200 and removing the third substrate (not shown) to expose the second side 304b of the third insulating layer 304, a second through substrate via (TSV) 322 is formed and extends from the second side 304b of the third insulating layer 304 through the third insulating layer 304 and a portion of the third device layer 305 to electrically connect to the third transistor 316. A second shielding structure 326 and a second conductive structure 324 are then formed on the second side 304b of the third insulating layer 304, wherein the second conductive structure 324 directly contacts a terminal of the second TSV 322, and the second shielding structure 326 is vertically (the stacking direction) overlapped with the third device region 316R. In a preferred embodiment, the second shielding structure 326 may completely overlap the entire area of the third device region 316R to provide better heat dissipation efficiency and electromagnetic shielding to the third device region 316R. According to an embodiment of the present invention, the second shielding structure 326 and the second conductive structure 324 may be formed simultaneously through the same process, and may include a same metal material such as copper, aluminum, nickel, silver, tin, platinum, titanium, iron, or a combination thereof, but is not limited thereto. In other embodiments, the second shielding structure 326 and the second conductive structure 324 may be formed by different processes and may include different metal materials. Following, a passivation payer 330 is formed on the second side 304b of the third insulating layer 304. As shown in FIG. 8, the second shielding structure 326 is completely covered by the passivation payer 330, and a portion of the second conductive structure 324 is exposed from an opening in the passivation layer 230.

In the second embodiment as shown in FIG. 8, the second conductive structure 324 is used as a bonding pad for electrical connecting to the outside circuits. The second shielding structure 326 is electrically isolated from other structures by being surrounded by the third insulating layer 304 and the passivation layer 330. The first shielding structure 226 is also electrically isolated from other structures by being surrounded by the second insulating layer 204 and the fourth insulating layer 408. In some embodiments, the first device region 116R, the second device region 216R, the first shielding structure 226, the third device region 316R, and the second shielding structure 326 may be vertically overlapped for obtaining a better electromagnetic shielding.

Figure 9:
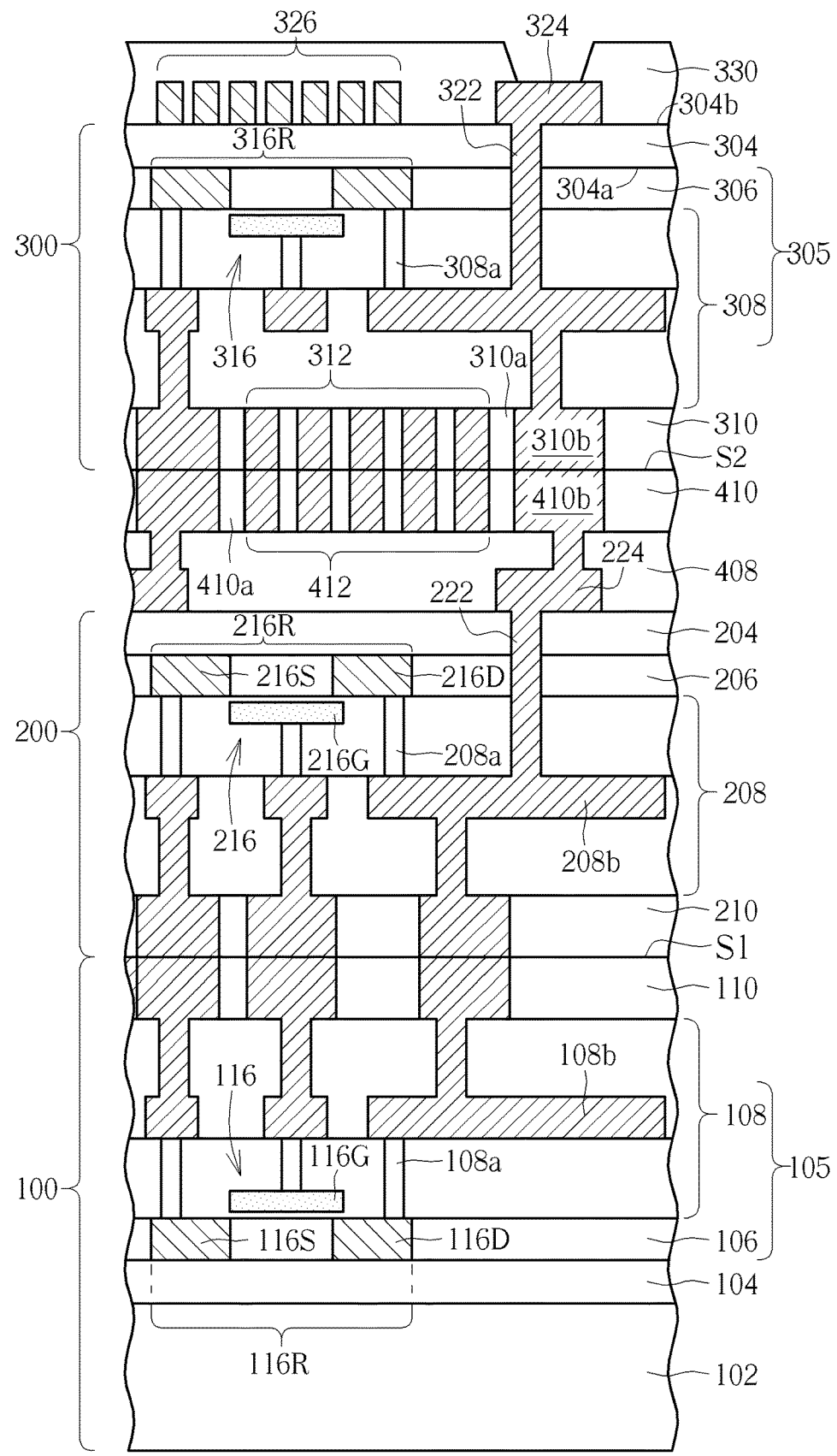
FIG. 9 is a schematic cross-sectional diagram illustrating a bonded semiconductor structure according to a third embodiment of the present invention.

Please refer to FIG. 9, which is a schematic cross-sectional diagram illustrating a bonded semiconductor structure according to a third embodiment of the present invention. The third embodiment shown in FIG. 9 differs from the second embodiment shown in FIG. 8 in that, the bonded semiconductor structure shown in FIG. 9 has shielding structures 412 and 312 formed in the fourth bonding layer 410 and the third bonding layer 310, respectively, instead of having shielding structures in the fourth insulating layer 408 (that is, on the second insulating layer 204 and covered by the fourth insulating layer 408). The shielding structures 412 and 312 may provide electromagnetic shielding effects as well as serve as bonding pads for bonding the second device wafer 200 and the third device wafer 300. The bonding interface S2 between the second device wafer 200 and the third device wafer 300 of the bonded semiconductor structure shown in FIG. 9 is formed by the shielding structures 412, the fourth bonding dielectric layer 410a, the fourth bonding pads 410b, the third bonding dielectric layer 310a, and the third bonding pads 310b. By forming the shielding structures 412 and 312 in the bonding layer, a larger design flexibility for the circuits (such as the first conductive structure 224) in the fourth insulating layer 408 may be achieved.

Figure 10:
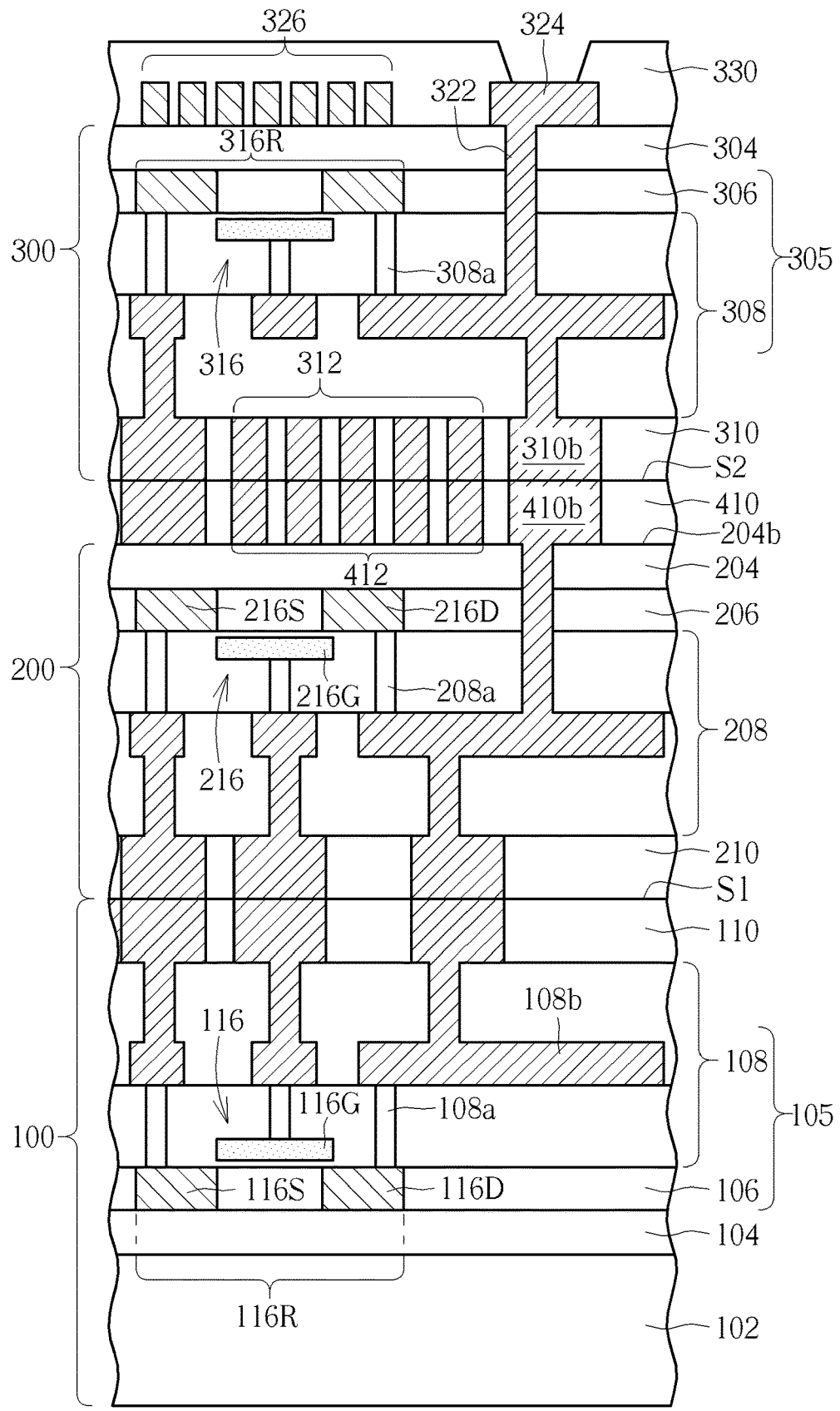
FIG. 10 is a schematic cross-sectional diagram illustrating a bonded semiconductor structure according to a fourth embodiment of the present invention.

Please refer to FIG. 10, which is a schematic cross-sectional diagram illustrating a bonded semiconductor structure according to a fourth embodiment of the present invention. The fourth embodiment shown in FIG. 10 differs from the third embodiment shown in FIG. 9 in that, the bonded semiconductor structure shown in FIG. 10 has the fourth bonding layer 410 having the shielding structure 412 directly disposed on the second side 204b of the second insulating layer 204, without forming any insulating layer (such as the insulating layer 408 shown in FIG. 9) between the fourth bonding layer 410 and the second insulating layer 204. In this way, the overall thickness of the bonded semiconductor structure may be reduced.

In conclusion, the bonded semiconductor structure provided by the present invention is featured for having a shielding structure formed on a side of the insulating layer opposite to the semiconductor layer and vertically overlapped with the device region of the semiconductor layer. The shielding structure may help to dissipate heat from the device region as well as provide electromagnetic shielding to the device region. Furthermore, the design of mirror transistors (such as the first transistor 116 and the second transistor 216) in the bonded semiconductor structure by the present invention may provide the required amount of current with a better current matching between the transistors while the areas of the respective transistors may be reduced to half, so that a smaller chip size and reduced harmonic distortions and signal cross-talk may be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A bonded semiconductor structure, comprising:
  a first device wafer, comprising:
    a first insulating layer;
    a first device layer on the first insulating layer and comprising a first device region and a first transistor disposed in the first device region; and a first bonding layer on the first device layer, wherein the first device layer is between the first insulating layer and the first bonding layer;

a second device wafer, comprising:
   a second insulating layer;
   a second device layer on a first side of the second insulating layer and comprising a second device region and a second transistor disposed in the second device region, wherein a first gate region of the first transistor and a second gate region of the second transistor are vertically aligned and electrically connected to a same gate voltage, a first source region of the first transistor and a second source region of the second transistor are vertically aligned and electrically connected to a same source voltage, a first drain region of the first transistor and a second drain region of the second transistor are vertically aligned and electrically connected to a same drain voltage; and
   a second bonding layer on the second device layer, wherein the second device wafer is bonded to the first device wafer by bonding the second bonding layer and the first bonding layer;

a shielding structure and a first conductive structure disposed on a second side of the second insulating layer opposite to the first side, wherein bottom surfaces of the shielding structure and the first conductive structure are flush to each other and in direct contact with a surface of the second insulating layer, and the shielding structure is vertically overlapped with the second device region, wherein the first conductive structure is used as a bonding pad; and a passivation layer on the second side of the second insulating layer, wherein the passivation layer completely covers the shielding structure and exposes a portion of the first conductive structure.

2. The bonded semiconductor structure according to claim 1, further comprising:
   a first through substrate via (TSV) through the second insulating layer and a portion of the second device layer and electrically connected to the second transistor, wherein the first conductive structure directly contacts the first TSV.

3. The bonded semiconductor structure according to claim 1, wherein the shielding structure and the first conductive structure comprise a same metal.

4. The bonded semiconductor structure according to claim 1, wherein the first bonding layer comprises a first bonding dielectric layer and a plurality of first bonding pads formed in the first bonding dielectric layer, the second bonding layer comprises a second bonding dielectric layer and a plurality of second bonding pads formed in the second bonding dielectric layer, wherein the first bonding pads and the second bonding pads are electrically bonded, respectively.

5. The bonded semiconductor structure according to claim 1, wherein the shielding structure is electrically isolated from the first device wafer and the second device layer, the second bonding layer, and the first conductive structure of the second device wafer.

6. The bonded semiconductor structure according to claim 1, wherein the shielding structure comprises a mesh-like pattern.

7. The bonded semiconductor structure according to claim 1, wherein the shielding structure comprises an array of strip-shaped patterns.

* * * * *